US009887008B2

(12) United States Patent
Lee et al.

(10) Patent No.: US 9,887,008 B2
(45) Date of Patent: Feb. 6, 2018

(54) DDR4-SSD DUAL-PORT DIMM DEVICE

(71) Applicant: Futurewei Technologies, Inc., Plano, TX (US)

(72) Inventors: Xiaobing Lee, Santa Clara, CA (US); Yansong Wang, Hangzhou (CN); Ting Li, Hangzhou (CN)

(73) Assignee: Futurewei Technologies, Inc., Plano, TX (US)

( * ) Notice: Subject to any disclaimer, the term of this patent is extended or adjusted under 35 U.S.C. 154(b) by 151 days.

(21) Appl. No.: 14/642,558

(22) Filed: Mar. 9, 2015

(65) Prior Publication Data

US 2015/0255130 A1    Sep. 10, 2015

Related U.S. Application Data

(60) Provisional application No. 61/950,708, filed on Mar. 10, 2014.

(51) Int. Cl.
*G06F 13/16* (2006.01)
*G11C 14/00* (2006.01)
(Continued)

(52) U.S. Cl.
CPC ...... *G11C 14/0045* (2013.01); *G06F 12/0246* (2013.01); *G06F 12/0868* (2013.01); *G06F 13/382* (2013.01); *G06F 13/4009* (2013.01); *G11C 14/0018* (2013.01); *H04L 67/1097* (2013.01); *G06F 2212/1024* (2013.01); *G06F 2212/174* (2013.01); *G06F 2212/263* (2013.01); *G06F 2212/7208* (2013.01); *G11C 13/0002* (2013.01)

(58) Field of Classification Search
CPC .......... G06F 3/068; G06F 12/00–12/16; G06F 13/00–13/4295
See application file for complete search history.

(56) References Cited

U.S. PATENT DOCUMENTS 4,752,897 A * 6/1988 Zoeller ............... G07C 3/14
250/559.45
8,930,647 B1 * 1/2015 Smith ............... G06F 9/44557
711/103

(Continued)

*Primary Examiner* — Nicholas Simonetti
(74) *Attorney, Agent, or Firm* — Schwegman Lundberg & Woessner, P.A.

(57) ABSTRACT

As a solution to the type of problems noted above, this disclosure provides novel methods and systems that include dual-port solid-state drive (SSD) DIMM devices to provide primary storage capabilities with very low latency and better availability of DDR4 devices. The dual-port DDR4-SSD flash memory devices guarantee primary storage devices still accessible with one CPU or network failure. The novel DDR4 memory bus devices may be used not only for memory media and storage device buffers, but also to allow two CPUs to share data stored in flash SSD chips and to greatly improve DDR4 bus efficiency and bus utilizations by block accesses and eliminate PCIE-DMA data transfers. Through the features of the claimed subject matter described herein, dual-port DDR4-DIMM memory devices can be achieved that provide an All-Flash-Array storage system with substantially higher reliability, availability, and performance over conventional SATA/SAS-SSD, PCIE-SSD, and NVME-SSD solutions.

31 Claims, 7 Drawing Sheets

(51) Int. Cl.
*G06F 13/38* (2006.01)
*G06F 13/40* (2006.01)
*H04L 29/08* (2006.01)
*G06F 12/02* (2006.01)
*G06F 12/0868* (2016.01)
*G11C 13/00* (2006.01)

(56) References Cited

U.S. PATENT DOCUMENTS

| | | | |
|---|---|---|---|
| 2008/0046666 A1* | 2/2008 | Termaine | G06F 12/0607 711/154 |
| 2008/0229049 A1* | 9/2008 | Nanda | G06F 13/1657 711/173 |
| 2010/0005220 A1* | 1/2010 | Loughner | G06F 13/426 711/5 |
| 2012/0054421 A1* | 3/2012 | Hiratsuka | G06F 12/0246 711/103 |
| 2013/0031390 A1* | 1/2013 | Smith, III | G06F 1/206 713/320 |
| 2013/0086311 A1* | 4/2013 | Huang | G06F 13/1689 711/103 |
| 2014/0181364 A1* | 6/2014 | Berke | G06F 13/16 711/103 |
| 2014/0192583 A1* | 7/2014 | Rajan | G11C 7/10 365/63 |
| 2014/0215277 A1* | 7/2014 | Judd | G06F 11/2284 714/42 |

* cited by examiner

DDR4-SSD DUAL-PORT DIMM DEVICE

CROSS REFERENCE TO RELATED APPLICATIONS

This application claims the benefit of U.S. Provisional Patent Application 61/950,708, filed Mar. 10, 2014 to Lee, entitled "DDR4-SSD DUAL-PORT DIMM BY HIGH-DENSITY FLEXIBLE-PACK DDR4-NVDIMM AS SSD LOW-LATENCY PRIMARY STORAGE," and is related to U.S. Provisional Patent Application 61/950,660 filed Mar. 10, 2014 to Lee et al., entitled "RDMA-SSD CLUSTERS ON-BLADES & DDR4-SSD HD-DIMM PRIMARY STORAGES." Each of these references are incorporated herein by reference.

BACKGROUND

Recently, the fourth generation of double data rate dynamic random access memory ("DDR4 SDRAM" or "DDR4") has become commercially available as a particular implementation of dynamic random access memory (DRAM) in computing devices (e.g., personal computers, workstations, servers, etc). Compared to previous generations, DDR4 SDRAM offers higher data transfer speeds and module densities, lower voltage requirements, and larger bandwidths. DDR4, as with previous generations and variant incarnations of DRAM, is most often implemented as memory integrated circuits incorporated on a memory module, most recently a dual in-line memory module ("DIMM"). DIMMs are most often attached to the main printed circuit board ("motherboard") of a computing device through one or more sockets. Typically, each DIMM includes a memory controller—a digital circuit that manages the flow of data going to and from the memory chips in the module. Alternately, the memory controller can be a separate chip or integrated into another chip on the motherboard.

Traditional information technology storage devices and servers are generally based on central processing units (CPUs) with dedicated single-port DDRx-DIMMs of DRAM plus periphery storage devices. For higher reliability, availability, serviceability, and performance storage systems, advanced technologies such as dual-port devices, dual-port serially-attached SCSI ("SAS") devices and/or dual-port non-volatile memory-express ("NVME") devices may be used instead.

While traditionally reserved to volatile memories, non-volatile random access memory DIMMS are beginning to emerge. NAND-Flash memory is one type of non-volatile block access memory, and flash memory chips are commonly used in data storage devices such as solid-state drives (SSD). New type non-volatile random access memories include Magnetoresistive Random-access Memory (MRAM) and Resistive Random-Access Memory (RRAM or ReRAM), each with their own advantages and disadvantages.

However, currently available RRAM, MRAM and NAND-Flash memory chips do not support the DDR4 interface. As such, these non-volatile memory chips cannot take advantage of the benefits of the current generation of DDR4 SDRAM interfaces. For example, a DDR3-SSD DIMM device with a DDR3-to-SATA interface using two SATA-SSD controllers and 8 NAND flash chips is built with throughput that is less than 10% of DDR3 bus bandwidth of a 3DPC (3 DIMMs per 64 bit channel) memory.

Recent dual-port NVME-SSD devices include PCIE periphery interfaces with direct memory access (DMA) transferring data packets to/from SSD units to/from host memory, at the lowest bus priority, due to having to wait for CPU cores using memory first. Moreover, only a limited number of NAND flash chips are typically used due to the potential latency from the lack of bus priority. As such these techniques offer only limited total storage capacity and I/O bandwidth.

SUMMARY

As a solution to the type of problems noted above, this disclosure provides novel methods and systems that include dual-port DDR4 solid-state drive (SSD) DIMM devices to provide primary storage capabilities with low latency. The dual-port DDR4-SSD flash memory devices can guarantee primary storage devices are still accessible when one CPU or network failed. The novel DDR4 memory bus devices may be used not only for memory media and storage device buffers, but also to allow two CPUs to share data stored in cache memory and flash SSD chips and to greatly improve DDR4 bus efficiency and bus utilizations by block accesses through a DDR4-8 bit channel without PCIE-DMA data transfers and IRQ delays. Through the claimed subject matter, low cost NAND flash chips can be used with DDR4 memory buses to take advantage of the low cost of consumer grade NAND chips.

According to an aspect of the claimed invention, a multi-channel DDR4-DIMM bus is provided by configuring a DDR4-64 bit bus into 8 independent DDR4-8 bit channels to carry ONFI signals and data flows for more efficient bus utilizations. In one or more embodiments, the multi-channel DDR4-SSD controllers may be implemented as an ARM64 CPU with the field-programmable gate array (FPGA), and/or as an application-specific integrated circuit (ASIC). According to one or more embodiments, each DDR4-8 bit channel can drive multiple (e.g., 2 or 3) DDR4-SSD DIMM devices as 2DPC or 3DPC. According to such an embodiment, 16 DDR4-8 bit channels can drive up to 32 or 48 DDR4-SSD DIMM devices to expand total storage capacity with high aggregated bandwidth through two DDR4-64 bit buses. In one or more embodiments, the DDR4-SSD DIMM device can be dual-port devices with one DDR4-8 bit channel accessed by a first ARM64 CP and another channel by a second ARM64 CPU for fault tolerance. According to various embodiments, DDR4-SSD DIMM expansion may be implemented as, variably: 1) a low cost FPGA-SSD at DDR3 speeds; 2) an ASIC implemented as a DDR4-SSD controller at DDR4 access rates; and 3) an ASIC that allows a DDR4-SSD DIMM to directly plug into DDR4-64 bit bus of conventional CPUs. Each of the embodiments provides lower latency while achieving higher density solid-state drive primary storage relative to conventional solutions.

According to another aspect of the claimed subject matter, the multi-channel DDR4-SSD DIMM bus is also equipped with 1 KB DDR4 block read/write acceleration in addition to DDR4 4-burst and 8-burst access to the DIMM CMD/Status and Metadata registers. According to an embodiment, the solutions provided herein add two CMD/Address buses (modified DRAM CMD/Address bus for more fan-outs) that are shared by the 8 DDR4-8 bit channels to improve the efficiency of the DDR4 bus. The read/write operations of 8 ONFI-over-DDR4 buses are independent of each other and, according to some embodiments, SSD-read operations can interrupt SSD-write operations in order to reduce the read latency when the written-data could be cached in the MRAM.

According to still another aspect of the claimed subject matter, a DDR4-SSD DIMM is provided that includes two or more printed circuit boards (packed PCBs) within the DDR4-DIMM form factor, thereby significantly expanding the DDR4 bus storage capacities over conventional solutions. According to one or more embodiments, DDR4-SSD dual-port DIMM devices can be built as 2-channel DIMMs for low-latency and high-density AFA/SSD storage systems (16 or 24 DDR4-SSD DIMMs per 64 bit bus, 16 TB capacity per DIMM) by boosting the ONFI operations over the DDR4 bus. Two separated CMD/Address control buses are shared by 8 DDR4-8 bit channels from two or more hosts to multiplex CMD/Address/CS# controls and a NVME command queue cut-through path for using 16 or 24 dual-port DDR4-SSD DIMM devices.

According to one or more embodiments, a DDR4-SSD ASIC and DDR4-ONFI adapters may be included to increase the access speed to more NAND flash memory chips. According to one or more embodiments, a DDR4-NVDIMM ASIC with DDR4-SD split data buffers are included to use relatively less DDR4-DRAM cache memory chips and more NAND flash chips for high performance host DDR4-64 bit bus applications.

BRIEF DESCRIPTION OF DRAWINGS

The accompanying drawings, which are incorporated in and form a part of this specification, illustrate embodiments of the disclosure and, together with the description, serve to explain the principles of the presently claimed subject matter:

DETAILED DESCRIPTION

Figure 1:
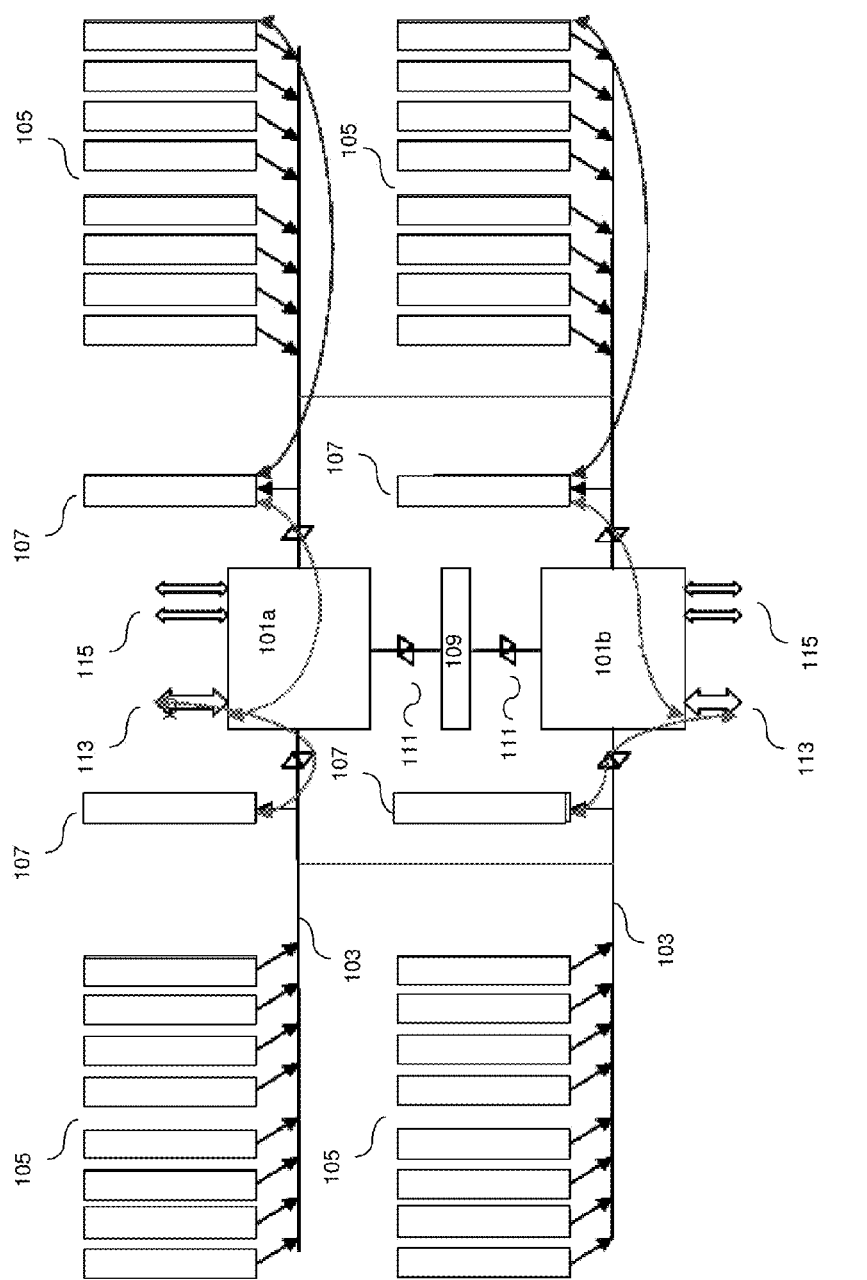
FIG. 1 depicts a block diagram of an exemplary topology for a dual-channel memory device that includes a multi-channel DIMM bus for flash memory units, in accordance with embodiments of the present invention.

Reference will now be made in detail to the preferred embodiments of the claimed subject matter, a method and system for the uses of Solid-State-Disk (SSD) and Non-Volatile-Memory (NVM) storage systems, examples of which are illustrated in the accompanying drawings. While the claimed subject matter will be described in conjunction with the preferred embodiments, it will be understood that they are not intended to limit these embodiments. On the contrary, the claimed subject matter is intended to cover alternatives, modifications and equivalents, which may be included within the spirit and scope as defined by the appended claims.

Furthermore, in the following detailed descriptions of embodiments of the claimed subject matter, numerous specific details are set forth in order to provide a thorough understanding of the claimed subject matter. However, it will be recognized by one of ordinary skill in the art that the claimed subject matter may be practiced without these specific details. In other instances, well known methods, procedures, components, and circuits have not been described in detail as not to obscure unnecessarily aspects of the claimed subject matter.

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer generated step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present claimed subject matter, discussions utilizing terms such as "storing," "creating," "protecting," "receiving," "encrypting," "decrypting," "destroying," or the like, refer to the action and processes of a computer system or integrated circuit, or similar electronic computing device, including an embedded system, that manipulates and transforms data represented as physical (electronic) quantities within the computer system's registers and memories into other data similarly represented as physical quantities within the computer system memories or registers or other such information storage, transmission or display devices.

Exemplary Topology

FIG. 1 depicts a block diagram of an exemplary topology 100 for dual-channel unified memory device that includes a multi-channel DIMM bus for aggregating more flash memory units, in accordance with embodiments of the present invention. In one embodiment, the topology may represent, for example, the architecture of a solid-state blade server. Exemplary features of the architecture depicted in FIG. 1 may include, for example, one or more unified memory controllers (101a, 101b) coupled to one or more dual-port flash DIMMs (105) via a multi-channel memory bus (103). According to further embodiments, the topology 100 may also include other volatile and non-volatile storage devices, such as volatile dynamic random access memory (DRAM) devices (107) and one dual-port non-volatile magnetoresisitve random access memory (MRAM) device (109). In one or more embodiments, the DRAM device (107) may function as a read cache for instructions and commands and data received in the memory unified controllers (101a, 101b) from two or four host CPUs (via PCIE port 113 for example), or from remote computing devices communicatively coupled through a network via two or four fabric interface ports 115. In one or more embodiments, the MRAM device (109) may function as a dual-port (111) write cache for data and metadata corresponding to instructions or commands from the host CPUs. In embodiments where a DRAM (107) is not present or is not otherwise used in this manner, the MRAM device (109) may operate as both a read and write cache. Since the MRAM is a non-volatile memory, after data is written to the MRAM, the ASIC SSD controller is able to signal or otherwise notify the CPU or remote clients that the write operation is completed prior to storing the data (from the MRAM) in the NAND chips. By using non-volatile MRAM as a write cache, the latency for data storage is greatly reduced, and the need for system backup power is also eliminated.

The unified memory controllers (101a, 101b) manage the flow of data to and from DIMMs coupled to the memory controller (101a, 101b) via the memory bus corresponding to the memory controller (101a, 101b). In an embodiment, the memory bus may comprise a DDR4 memory bus with at least one channel of X number of bytes equal to the number of DIMMs attached to the channel. For instance, as depicted in FIG. 1, each particular array of DIMMs (105) comprises 8 total DIMMs (105), and an 8 byte channel may be used in the memory bus (103) to coordinate data between the DIMMs (105) and the memory controller (101a, 101b), with each byte (8 bits) of the 8 byte channel comprising a bus link corresponding specifically with a particular DIMM (e.g., $1^{st}$ byte corresponds to $1^{st}$ DIMM, $2^{nd}$ byte corresponds to $2^{nd}$ DIMM, etc.).

In one or more embodiments, one or both of the host controllers may be implemented as a field programmable gate array (FPGA). In some instances, one or both of the host controllers may be implemented as an ARM CPU, for example. DIMMs (105) may be implemented, in some embodiments, as discrete circuit boards that include one or more memory storage chips. These chips may comprise, for example, non-volatile storage, such as NAND flash memory units. According to further embodiments, each DIMM 105 device is dual-port, thereby allowing simultaneous read and write operations from two hosts. DDR4 data-buffers may be used on a DIMM to maximize the bus speed in 2DPC or 3DPC bus loads. According to one or more embodiments, two CMD/Address control channels in bus (103) are time-shared by the two or more hosts to multiplex up to 16 CMD/Address/CS# controls for all of the (e.g., 16 or 32) dual-port DDR4-SSD DIMM devices. According to such an embodiment, packed 2-PCBs may be included in a single 4-sided DIMM device to pack 64 NAND flash chips on a DDR4-SSD DIMM plug-in unit, and/or packed 5-PCBs into one 10-sided DIMM plug-in unit for a total of up to 160 NAND flash chips.

Figure 2:
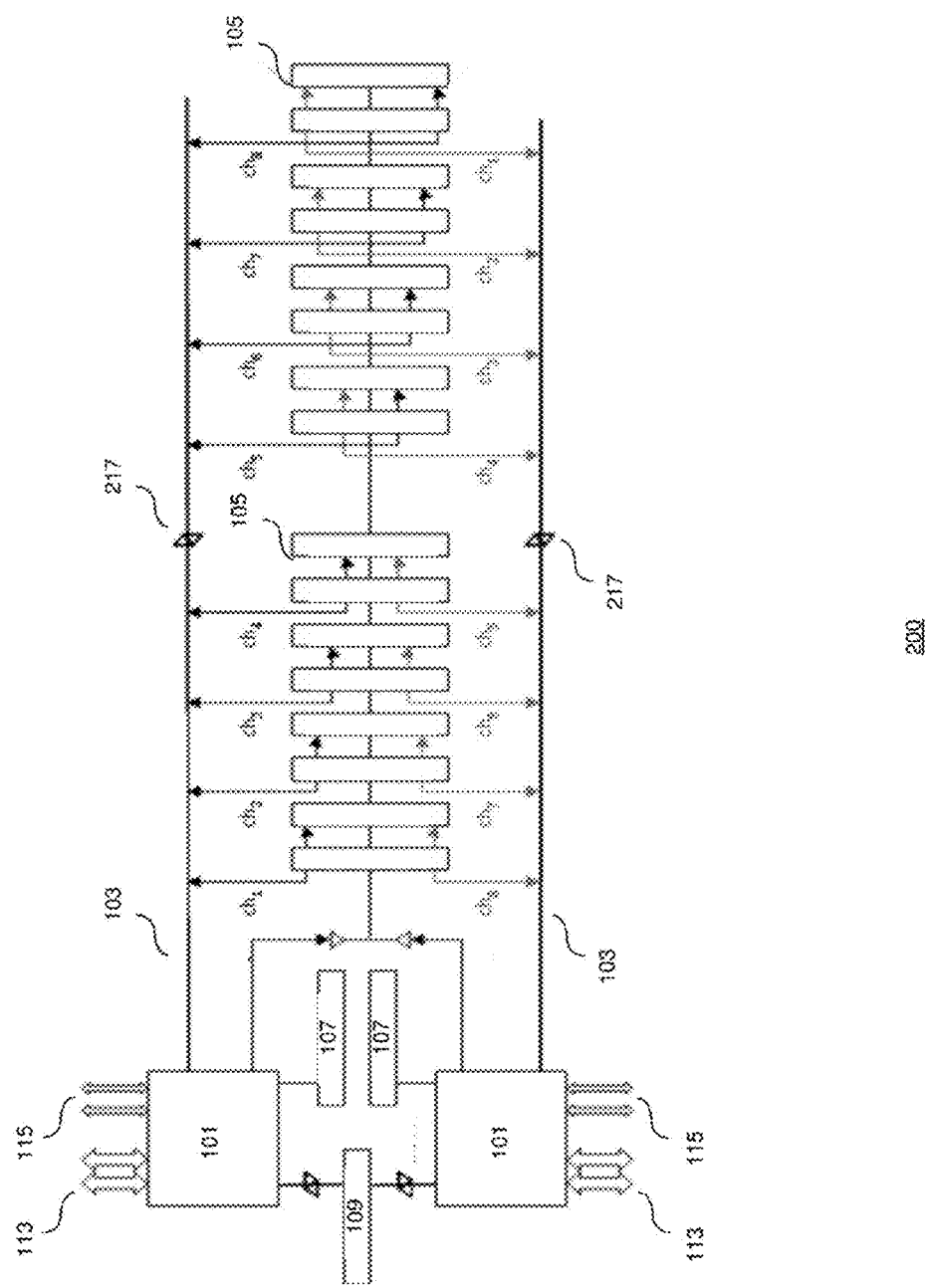
FIG. 2 depicts a block diagram of an exemplary for two unified memory controllers to share multiple dual-channel flash memory devices that include data-buffer adapters to scale a DDR4-64 bit bus into multiple DDR4-8 bit channels to aggregate more DDR4-SSD DIMM devices that convert to the ONFI-NVDDR2 channels for more NAND flash memory chips on each DIMM unit, in accordance with embodiments of the present invention.

FIG. 2 depicts a block diagram of an exemplary topology for a dual-port memory device that includes data-buffer adapters to scale a DDR4-8 bit channel into multiple ONFI-NVDDR2 channels for accessing more NAND flash memory chips, in accordance with embodiments of the present invention. Specifically, FIG. 2 depicts the DDR4-SSD dual-port DIMMs over 8 DDR4-8 bit channels system topology for two Hosts/Controllers. As presented, FIG. 2 includes the memory controllers (101), memory bus (103), DIMM storage devices (105), DRAM (107), MRAM (109), and the hosts and network input buses/interfaces (113, 115). As depicted in FIG. 2, each memory controller (101) has a multi-channel (e.g., 8-channel) DDR4 bus (103) to access each of the (e.g., 16) attached dual-port DDR4-SSD dual-port DIMMs (105). According to such an embodiment, each DDR4 channel may use a single byte (8-bits) of the (e.g. 8 byte) channel to access two DDR4 DIMM loads for all of the DDR4-SSD DIMMs (105) working at maximum speed rate. Each DDR4-SSD dual-port DIMM (105) may be connected to both hosts for fault-tolerance and simultaneous dual-access.

In one or more embodiments, DDR4 Data-Buffers (217) may be used to support multiple DIMMs, even with bus traces of insufficient length. For example, embodiments of the present disclosure provide printed circuit boards where a bus trace is terminated then relayed when signal integrity worsens to reach every DIMM socket such that each channel has 2DPC loads in long traces. According to such embodiments, data-buffers are used to receive (and terminate) the signal from the memory controllers, and re-propagate the signal to the DIMMs when the bus traces are too long. As presented in FIG. 2, DIMM devices corresponding to channels 5-8 of the top memory controller (101) and DIMM devices corresponding to channels 1-4 of the bottom memory controller (101) may not be directly driven by the bus trace in the underlying circuit board. Data accesses for read and write operations to those channels have to be buffered and retransmitted by Data Buffers (217) when traces are longer than certain length.

For a data write to a flash page in a DDR4-SSD DIMM unit, the data is written through one DDR4-8-bit channel (e.g., 1 byte of DDR4-64 bit bus 103) and one 8-bit control bus of cmd/address/queues to the DIMM device 105 as ONFI-over-DDR4. The ONFI cmd/address are carried by the 8-bit control bus and the ONFI data flows are synchronously carried by the related DDR4-8-bit channel in 1 KB burst transfers separately. According to one or more embodiments, up to 16 concurrent write or read transfers can be carried by the 8 DDR4-8-bit channels by one controller (101) and the other 8 DDR4-8-bit channels by the other controller (101). The controllers are able to simultaneously access the 16 dual-port DDR4-SSD DIMM units for higher than 95% bus utilization of the unified memory bus (103) with modified DDR4 cmd/address bus (two 8-bit control buses) shared by 8 DDR4-SSD DIMM devices.

For a flash read request, the NVME cmd queues are sorted to one of the 16 DDR4-SSD DIMM units according to the flash translation layer (FTL) tables in the host software and ARM64 firmware with the associated read cmd queues are mixed within the write cmd/address flows. The ARM64 firmware will poll the status registers on the DDR4-SSD DIMM device. As one read data buffer on the DIMM 105 is ready, the on-going write burst transfer (accumulating toward 16 KB page) will be interrupted, before starting the read burst (512 B or 1 KB toward 4 KB or 1 MB according the read cache buffers) accesses from the DIMM device 105, and written to the read cache DRAM of the same storage node, where it can be accessed by the client. If the read data is in the read cache buffer, there is no need to read from the DDR4-SSD DIMM unit, As such, the host and ARM64 firmware processes the cache buffer first, then the FTL after a read cache-miss.

Figure 3A:
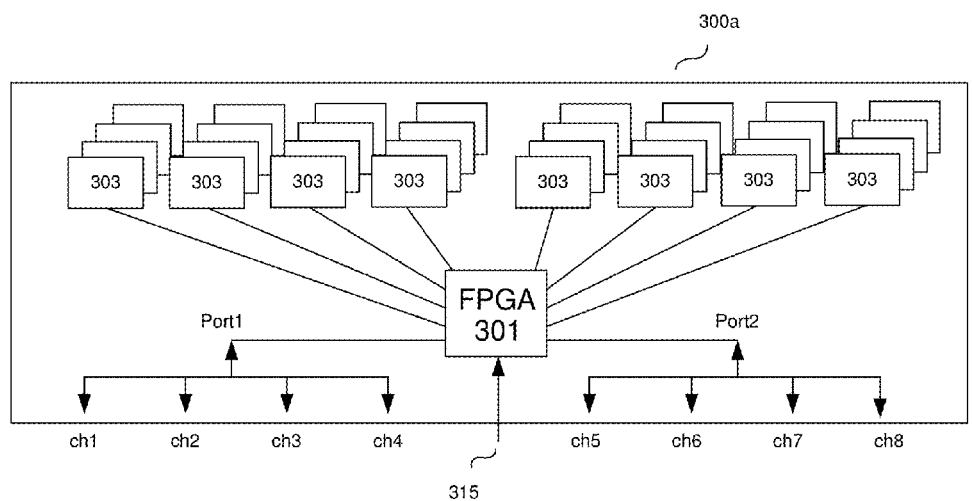
FIG. 3a depicts a block diagram of an exemplary dual-port DIMM for flash memory with a field programmable gate array adapter (FPGA) at DDR3 speed for bare NAND accesses, in accordance with embodiments of the present invention.

FIG. 3a depicts a block diagram of an exemplary dual-port DIMM device (300a) for flash memory with a field programmable gate array adapter (301a), in accordance with embodiments of the present invention. More specifically, FIG. 3a may depict a DDR4-SSD dual-port DIMM device (300a) with a FPGA adapter (301a) for two access paths (Port 1, Port 2). In an embodiment, each of the access paths may operate at low speed for low cost bare NAND access. For example, DDR3 signaling may be received (via channel 315) with centralized ONFI control and LDPC-ECC at the unified memory controllers or ARM64-CPUs. In an embodiment, the FPGA controller 300a terminates the received DDR3 signals, buffers the ONFI-over-DDR3 data-stream, and subsequently re-transfers the data stream at ONFI-NVDDR2 signals to the corresponding NAND flash memory chips (303). In an embodiment, FIG. 3a depicts a DDR4 multi-channel architecture that runs with DDR3 signals carrying ONFI3.0 command and data streams through 16 ONFI-NVDDR2 channels to coupled NAND flash memory chips (303).

Figure 3B:
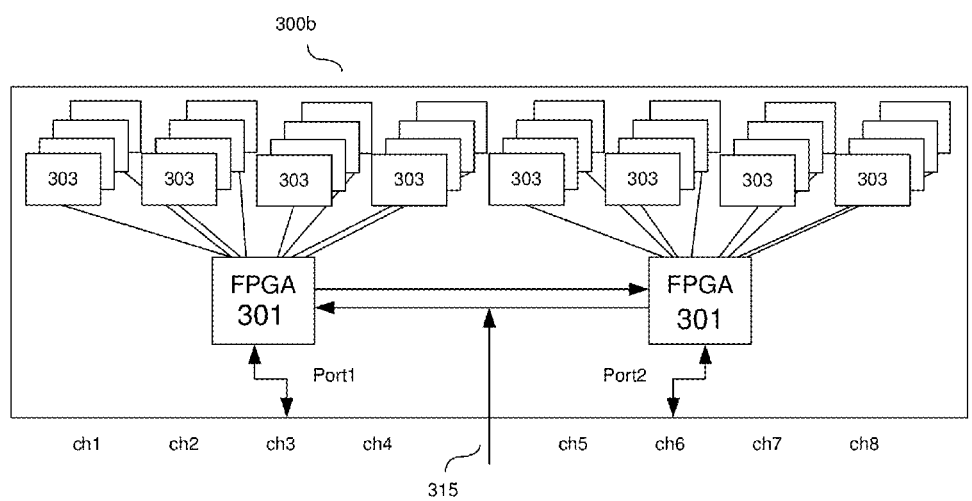
FIG. 3b depicts a block diagram of an exemplary dual-port DIMM for flash memory with multiple field programmable gate array adapters for packed PCBs up to 64 NAND chips per DIMM, in accordance with embodiments of the present invention.

FIG. 3b depicts a block diagram of an exemplary dual-port DIMM device (300b) for flash memory with multiple field programmable gate array adapters (301b, 301c), in accordance with embodiments of the present invention. More specifically, FIG. 3b depicts an exemplary DDR4-SSD dual-port DIMM device (300b) with FPGA1 (301b) and FPGA2 (301c) adapters for two access paths (Port 1 and Port 2). According to an aspect of the claimed subject matter, each FPGA (301b, 301c) is operable to terminate a received signal (e.g., DDR3 signals) via channel 315, to buffer the data as high-speed ONFI-compliant data, and to re-transfer data as non-volatile dual dynamic read signals (e.g., DDR2 signals). In one or more embodiments, the exemplary DDR4-SSD dual-port DIMM device (300b) of FIG. 3b has a DDR4 multi-channel architecture but runs DDR3 signals that carry ONFI3.0 cmd/data streams to multiple ONFI-NVDDR2 channels to access a large number of NAND flash memory chips (303) over 2-packed PCBs to double storage capacity. According to such embodiments, the two FPGA chips not only make flexibly packed multi-PCB (for form factor considerations) routing easy, but also is capable of doubling I/O throughputs by aggregating more NAND flash chips.

Figure 4A:
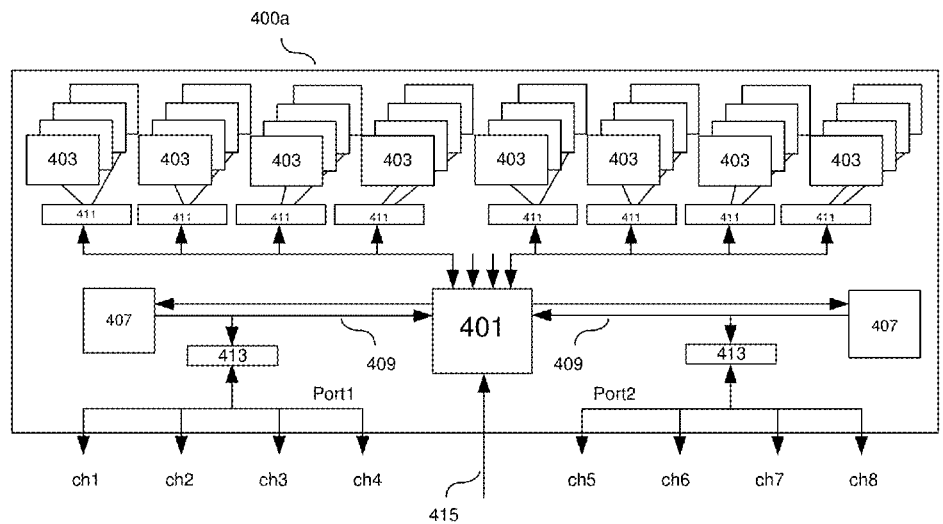
FIG. 4a depicts a block diagram of an exemplary dual-port DIMM for flash memory units with an application specific integrated circuit (ASIC) SSD controller with DDR4-SSD interface in compliance with ONFI standards and low-density parity-check-error correcting code (LDPC-ECC) capabilities, in accordance with embodiments of the present invention.

FIG. 4a depicts a block diagram of an exemplary dual-port DIMM device 400a for flash memory chips (403) with an application specific integrated circuit (ASIC) adapter (401a) in accordance with embodiments of the present invention. More specifically, FIG. 4a depicts an exemplary DDR4-SSD dual-port DIMM (400a) with an ASIC SSD controller (401a) and a number of DDR4-to-ONFI adapters (411) to access a plurality of NAND flash memory chips (403). In an embodiment, the ASIC SSD controller (401a) is implemented with two DDR4-8 bit ports for two hosts to share DDR4-DRAM devices (407) as an elastic-buffer of DDR4-to-DDR2 rate-adaptations with DDR4-data buffers (413). In one or more embodiments, two DDR4-8 bit host channels are linked to two unified memory controllers through ch3 and ch6. According to one or more embodiments, two CMD/Address control bus 415 are used to carry ONFI and NVME cmd/address queues from two unified memory controllers, then to control the attached DRAM devices (407) to buffer 1 KB block read/write data flows.

Figure 4B:
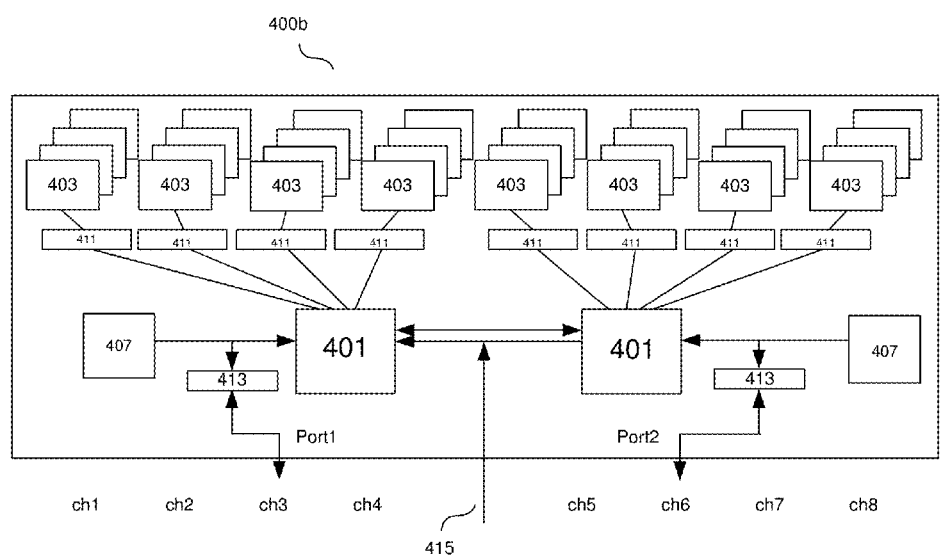
FIG. 4b depicts a block diagram of an exemplary dual-port DIMM for flash memory units with multiple application specific integrated circuit (ASIC) adapters for packed PCBs in compliance with ONFI standards that include LDPC-ECC capabilities and PCB scaling capabilities, in accordance with embodiments of the present invention.

FIG. 4b depicts a block diagram of an exemplary dual-port DIMM device (400b) for NAND flash memory chips (403) with multiple application specific integrated circuit adapters (ASICs 401b, 401c) and a number of DDR4-to-ONFI adapters (411) to access more NAND flash memory chips (403), in accordance with embodiments of the present invention. In one or more embodiments, the ASIC controllers (401b, 401c) may be equipped with two 8-bit ports for the two hosts (401b, 401c) to share DDR4-DRAM (407) as an elastic-buffer of DDR4-to-DDR2 rate-adaptations with a DDR4-DB (Data Buffers 413). In an embodiment, each ASIC SSD controller has six DDR4-8 bit channels, 1 for the host bus, 1 for an inter-connection between the two ASICs, and four for DDR4-to-ONFI adapters. As depicted, two ASIC SSD controllers are used for 2-packed PCBs to aggregate more NAND flash memory chips with significantly increased storage capacity and I/O performances.

Figure 5:
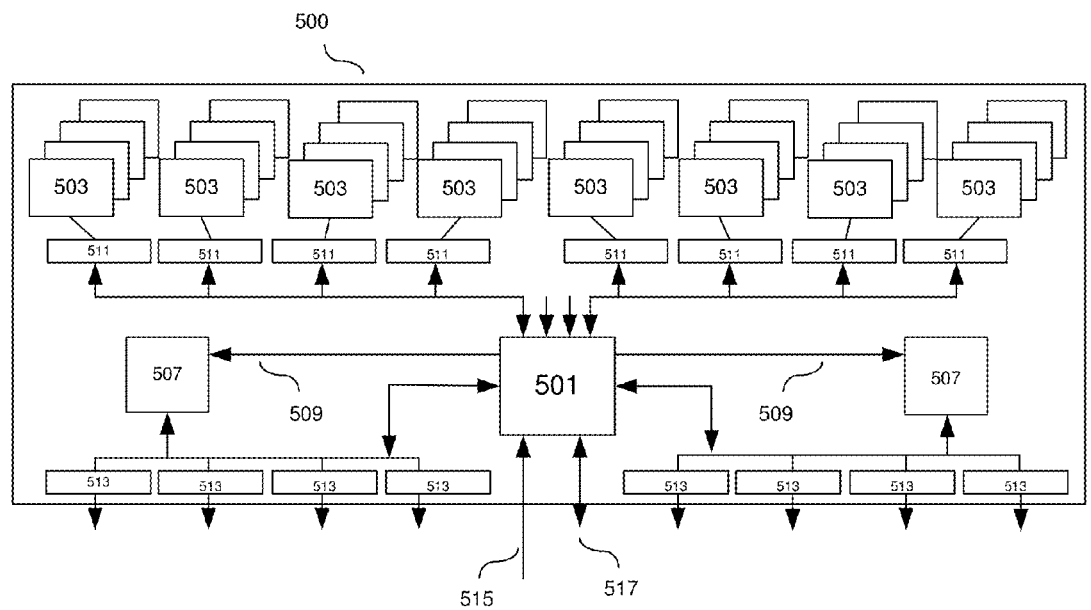
FIG. 5 depicts a block diagram of an exemplary dual-port DIMM for flash memory units with an application specific integrated circuit adapter that includes a split data buffer (DDR4-SD) for each channel to be compatible with the DDR4-64 bit bus of conventional CPUs and SoCs, in accordance with embodiments of the present invention.

FIG. 5 depicts a block diagram of an exemplary dual-port DIMM device (500) for flash memory units (503) with an ASIC adapter (501) that includes a data buffer (513) for each channel, in accordance with embodiments of the present invention. More specifically, FIG. 5 depicts an exemplary DDR4-NV DIMM device (500) with an ASIC SSD controller (501) and DDR4-SD data buffers (513) that follow a FIFO protocol to terminate instructions from a DDR4 bus, then to allow ASIC sequentially read/write FIFO to DDR4-DRAM elastic-buffer at a (potentially) slower rate. According to one or more embodiments, the DDR4-SD allows greater area for NAND chips as a low latency SSD primary storage device at DDR4-DRAM bus rather than power-down protection present in current NVDIMMs.

According to an embodiment, the ASIC SSD Controllers (401a, 401b, 401c, 501) of FIGS. 4a, 4b, and 5 ASIC SSD controllers may comprise the same ASIC chip but operating different firmware.

Figure 6B:
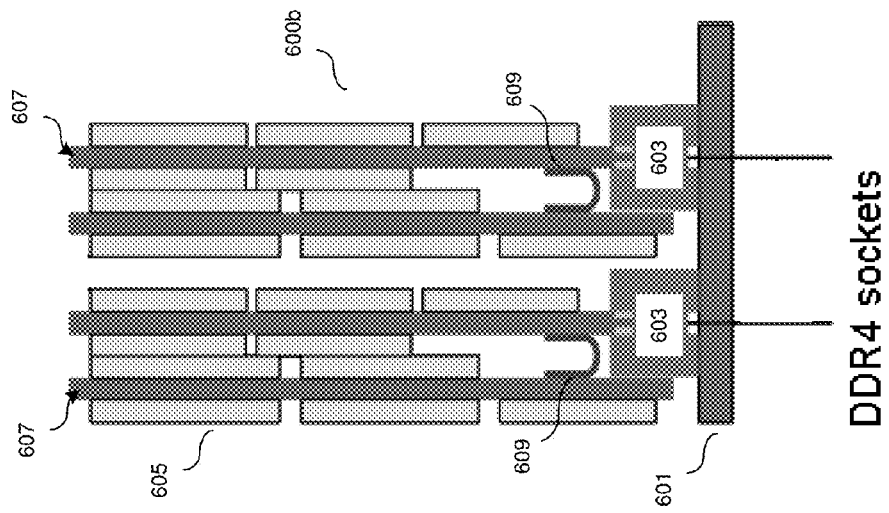
FIG. 6b depicts a block diagram of an exemplary 4-sided DIMM on flexibly connected printed circuit boards (flex packed 2-PCBs), in accordance with embodiments of the present invention.
Figure 6A:
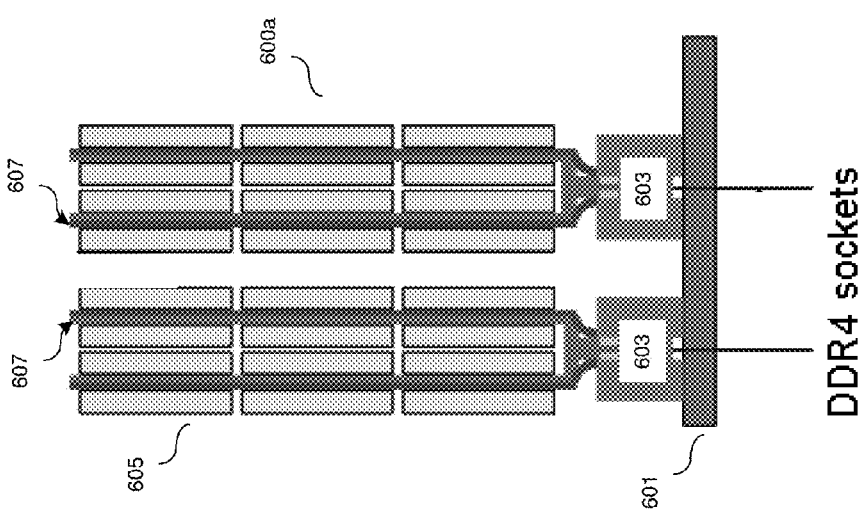
FIG. 6a depicts a block diagram of an exemplary 4-sided DIMM on rigidly connected printed circuit boards (hard packed 2-PCBs), in accordance with embodiments of the present invention.

FIG. 6a depicts exemplary DDR4-SSD DIMM devices (600a) with two rigidly-linked printed circuit boards (607) to pack multiple NAND MLC chips (605). In one or more embodiments, a DDR4-NVDIMM (ONFI SSD) device (600a) can be inserted in a socket (603) corresponding to a host DDR4 bus in a main printed circuit board (601) for lower IO-latency than a PCIE-SSD card. In one or more embodiments, the DDR4-SSD DIMM 600a may also include one or more adapters with functionality that provides DDR4-to-ONFI control-Regx (write-only), DDR4-to- ONFI status-Regx (read-only), and DDR4-DRAM buffers and/or DMA-spaces. According to one or more embodiments, one or more CPUs access them by a device drive as stream-I/O with multiple data-FIFOs. According to one such embodiment, the device driver writes ONFI command queues to control-Regx, writes data to each FIFOs normally; then polls status-Regx cmd-execution statuses and FIFOs data-ready statuses. In one or more embodiments, CPUs may read FIFOs as data-ready, and hardware interrupt pins may also be added.

FIG. 6b depicts exemplary DDR4-SSD DIMM devices (600a) with two flexibly-linked printed circuit boards (607) to pack multiple NAND MLC chips (605). As depicted in FIG. 6b, the printed circuit boards (607) may be flexibly linked using a flexible data channel 609 that allows for a reduction in total relative height of the DIMM when socketed relative to rigidly linked circuit boards. In one or more embodiments, a DDR4-NVDIMM (ONFI SSD) device (600b) can be inserted in a socket (603) corresponding to a host DDR4 bus in a main printed circuit board (601) for lower IO-latency than a PCIE-SSD card.

In one or more embodiments, the DDR4-SSD DIMM 600a may also include one or more adapters with functionality that provides DDR4-to-ONFI control-Regx (write-only), DDR4-to-ONFI status-Regx (read-only), and DDR4-DRAM buffers and/or DMA-spaces. According to one or more embodiments, one or more CPUs access them by a device drive as stream-I/O with multiple data-FIFOs. According to one such embodiment, the device driver writes ONFI command queues to control-Regx, writes data to each FIFOs normally; then polls status-Regx cmd-execution statuses and FIFOs data-ready statuses. In one or more embodiments, CPUs may read FIFOs as data-ready, and hardware interrupt pins may also be added.

Figure 7A:
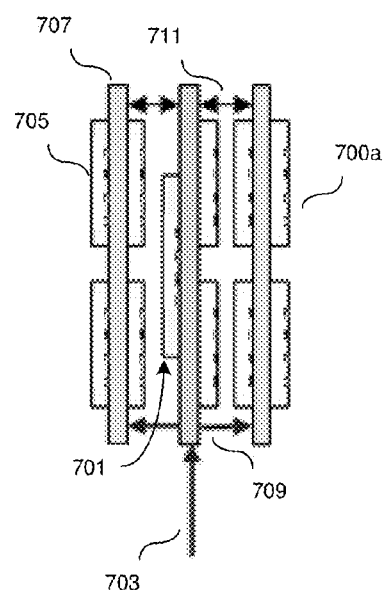
FIG. 7a depicts a block diagram of an exemplary 6-sided DIMM on three connected printed circuit boards (hard packed 3-PCBs), in accordance with embodiments of the present invention.

FIG. 7a depicts a block diagram of an exemplary 6-sided DIMM device (700a) on three connected printed circuit boards (707), in accordance with embodiments of the present invention. As depicted in FIG. 7a, each side of the three printed circuit boards (707) may comprise multiple memory chips (705), such as, but not exclusive to, multi-level cell NAND flash memory chips described elsewhere in this description. An SSD controller (701) is provided to adapt DDR4 instructions received (via input channel 703) to a protocol compatible with the memory chips (705), such as DDR ONFI compliant protocols. Data accesses may be provided via one or more buses interconnecting the printed circuit boards (707). In an embodiment, the buses (711) may be provided at or near the top of the printed circuit boards (707). Power and a ground outlet may be provided at or near the bottom of the printed circuit boards (709).

Figure 7B:
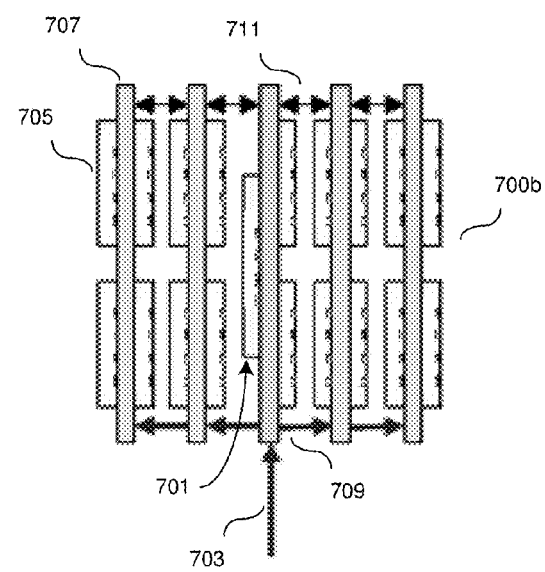
FIG. 7b depicts a block diagram of an exemplary 10-sided DIMM on five connected printed circuit boards (hard packed 5-PCBs), in accordance with embodiments of the present invention.

FIG. 7b depicts a block diagram of an exemplary 10-sided DIMM device (700b) on five connected printed circuit boards (707), in accordance with embodiments of the present invention. As depicted in FIG. 7b, each side of the five printed circuit boards (707) may comprise multiple memory chips (705), such as, but not exclusive to, multi-level cell NAND flash memory chips described elsewhere in this description. An SSD controller (701) is provided to adapt DDR4 instructions received (via input channel 703) to a protocol compatible with the memory chips (705), such as DDR ONFI compliant protocols. Data accesses may be provided via one or more buses interconnecting the printed circuit boards (707). In an embodiment, the buses (711) may be provided at or near the top of the printed circuit boards (707). Power and a ground outlet may be provided at or near the bottom of the printed circuit boards (709).

Through the features of the claimed subject matter described herein, dual-port DDR4-DIMM memory devices can be achieved that provide an All-Flash-Array storage system with substantially higher reliability, availability, and performance over conventional solutions.

What is claimed is:

1. A computing device comprising:
   a printed circuit board (PCB) comprising:
   a plurality of host processors configured to generate instructions under a double data rate dynamic random access memory 4 (DDR4) protocol;
   a memory device comprising a plurality of dual port direct in-line memory modules (DIMMs) configured to provide simultaneous read and write operations, wherein each of the dual port DIMMs include a plurality of solid-state disk (SSD) memory devices; and a DDR4-to-SSD adapter included on each of the plurality of DIMMS to terminate one or both of dynamic random access memory 3 (DDR3) and DDR4 data signals, and transfer one or both of DDR3 and DDR4 received data streams to the SSD memory devices as non-volatile memory signals;
   a plurality of memory controllers configured to manage a flow of data between the plurality of host processors and the plurality of DIMMS; and
   a memory bus communicatively coupling the plurality of memory controllers with the plurality of DIMMs, the memory bus transmits data between the plurality of memory controllers and the plurality of DIMMs through a plurality of DDR channels, wherein a DDR channel includes multiple bytes and each byte of the DDR channel accesses a different DIMM of the plurality of DIMMs; and
   wherein the plurality of solid-state disk memory devices are configured to operate collectively as a primary storage device of the computing device.

2. The computing device of claim 1, wherein a memory controller of the plurality of memory controllers comprises a field programmable gate array (FPGA).

3. The computing device of claim 2, wherein the FPGA is configured to adapt the plurality of instructions from a processor of the plurality of processors to be compatible with the plurality of DIMMs.

4. The computing device of claim 2, wherein the FPGA comprises an ARM processor.

5. The computing device of claim 1, wherein a memory controller of the plurality of memory controllers comprises an application specific integrated circuit (ASIC).

6. The computing device of claim 5, wherein the memory controller further comprises a DDR4 adapter configured to adapt a plurality of instructions from a processor of the plurality of host processors to be compatible with a DIMM of the plurality of DIMMs corresponding to the ASIC.

7. The computing device of claim 6, wherein the DDR4 adapter is configured to adapt the plurality of instructions to be compliant with Open NAND Flash Interface Working Group (ONFI) standards.

8. The computing device of claim 7, wherein the DDR4 adapter comprises a shared command and address bus and a flash ONFI bus.

9. The computing device of claim 1, wherein the memory device further comprises at least one of:
   a plurality of Magneto-resistive Random-access Memory (MRAM) memory devices;
   a plurality of Resistive Random-Access Memory (RRAM) memory devices; and a plurality of dynamic random access memory devices (DRAM) memory devices.

10. The computing device of claim 9, wherein the plurality of MRAM memory devices are configured as a write cache for the computing device.

11. The computing device of claim 9, wherein the plurality of DRAM memory devices are configured as a read cache for the computing device.

12. The computing device of claim 1, wherein the plurality of solid-state memory devices comprises a plurality of NAND flash memory devices.

13. The computing device of claim 12, wherein the plurality of flash memory devices comprises a plurality of multi-level cell NAND flash memory devices.

14. The computing device of claim 1, wherein the DDR4-to-SSD adapter included on the plurality of DIMMS includes a dual_port DDR4 interface.

15. The computing device of claim 1, the memory bus comprises a peer-to-peer channel linking each of the plurality of DIMMs.

16. The computing device of claim 15, wherein the peer to peer channel comprises a number of bytes, the number of bytes corresponding to the plurality of DIMMs, wherein at least one byte of the number of bytes is configured as a bus link to each of the plurality of DIMMs.

17. The computing device of claim 16, wherein data addressing performed for a target DIMM of the plurality of DIMMs uses a bus link corresponding to the target DIMM.

18. The computing device of claim 16, wherein the memory bus comprises a bus trace, further wherein the bus trace is of insufficient length to reach a portion of the plurality of DIMMs.

19. The computing device of claim 18, further comprising a DDR4 data buffer coupled to the bus trace and the portion of the plurality of DIMMs, the DDR4 data buffer being configured to receive a data signal from the bus trace addressed to a portion of the plurality of DIMMs, and to propagate the data signal to the portion of the plurality of DIMMs.

20. The computing device of claim 1, wherein a DDR channel includes multiple bytes and each byte of the DDR channel accesses a different pair of DIMMs of the plurality of DIMMs.

21. A device comprising:
a dual port direct in-line memory module (DIMM) configured to provide simultaneous read and write operations, wherein the dual port DIMM includes:
a plurality of printed circuit boards (PCBs);
a plurality of non-volatile solid-state disk (SSD) memory units provided on the plurality of PCBs;
a DDR to SSD adapter to terminate one or both of dynamic random access memory 3 (DDR3) and dynamic random access memory 4 (DDR4) data signals, and transfer one or both of DDR3 and DDR4 received data streams to the SSD memory devices as non-volatile memory signals;
at least one SSD controller provided on a PCB of the plurality of PCBs, the at least one SSD controller being configured to manage a plurality of instructions generated by a processor and intended for the plurality of non-volatile SSD memory units; and
a memory bus communicatively coupling the at least one SSD controller with a plurality of DIMMs including the dual port DIMM, the memory bus transmits data between the at least one SSD controller and the plurality of DIMMs through a plurality of DDR channels, wherein a DDR channel includes multiple bytes and each byte of the DDR channel accesses a different DIMM of the plurality of DIMMs,
a multi-port DDR interface operatively coupled to the at least one SSD controller, wherein each port of the multi-port DDR interface is operatively coupled to a different portion of a DDR channel,
wherein the device is configured to be seated in a random access memory socket of a main printed circuit board.

22. The device of claim 21, wherein the plurality of instructions correspond to a plurality of instructions under a double data rate dynamic random access memory 4 (DDR4) protocol.

23. The device of claim 21, wherein the plurality of PCBs are communicatively coupled to each other via a flexible data link.

24. The device of claim 21, wherein the memory controller comprises a field programmable gate array (FPGA).

25. The device of claim 24, wherein the FPGA comprises an ARM processor.

26. The device of claim 21, wherein the memory controller comprises an application specific integrated circuit (ASIC).

27. The device of claim 26, wherein the memory controller further comprises a plurality of DDR4 to ONFI adapters as the plurality of DDR to SSD adapters.

28. The device of claim 21, wherein the plurality of non-volatile SSD storage units comprises a plurality of NAND flash memory units.

29. The device of claim 21, wherein the SSD memory units are configured as a primary storage device for a computing device.

30. The device of claim 21, wherein the SSD controller includes a command/address channel, multiple DDR host channels coupled to the multi-port DDR interface, and multiple DDR to SSD channels.

31. The device of claim 21, wherein the at least one SSD controller includes two SSD controllers, wherein each SSD controller includes a command/address channel, a DDR host channel, an inter-connection channel between the SSD controllers, and multiple DDR to SSD channels.

* * * * *

UNITED STATES PATENT AND TRADEMARK OFFICE
CERTIFICATE OF CORRECTION

PATENT NO.       : 9,887,008 B2
APPLICATION NO.  : 14/642558
DATED            : February 6, 2018
INVENTOR(S)      : Lee et al.

Page 1 of 1

It is certified that error appears in the above-identified patent and that said Letters Patent is hereby corrected as shown below:

In the Specification

In Column 1, Line 48, delete "DIMMS" and insert --DIMMs-- therefor

In Column 5, Lines 31-32, delete "magnetoresisitve" and insert --magnetoresistive-- therefor In Column 7, Line 39, delete "300a" and insert --301a-- therefor In the Claims In Column 10, Line 19, in Claim 1, delete "DIMMS" and insert --DIMMs-- therefor In Column 10, Line 26, in Claim 1, delete "DIMMS;" and insert --DIMMs;-- therefor In Column 11, Line 16, in Claim 14, delete "DIMMS" and insert --DIMMs-- therefor Signed and Sealed this
Twenty-fifth Day of June, 2019

Andrei Iancu
*Director of the United States Patent and Trademark Office*